(12) United States Patent
Kasten

(10) Patent No.: US 9,620,273 B2
(45) Date of Patent: Apr. 11, 2017

(54) MAGNET SYSTEM FOR GENERATION OF A HIGHLY STABLE MAGNETIC FIELD

(71) Applicant: Bruker BioSpin GmbH, Rheinstetten (DE)

(72) Inventor: Arne Kasten, Karlsruhe (DE)

(73) Assignee: Bruker BioSpin GmbH, Rheinstetten (DE)

( * ) Notice: Subject to any disclaimer, the term of this patent is extended or adjusted under 35 U.S.C. 154(b) by 805 days.

(21) Appl. No.: 13/967,380

(22) Filed: Aug. 15, 2013

(65) Prior Publication Data
US 2014/0066312 A1  Mar. 6, 2014

(30) Foreign Application Priority Data

Aug. 31, 2012 (DE) ........................ 10 2012 215 507

(51) Int. Cl.
*H01F 6/06* (2006.01)
*G01R 33/3815* (2006.01)

(52) U.S. Cl.
CPC ........... *H01F 6/06* (2013.01); *G01R 33/3815* (2013.01)

(58) Field of Classification Search
CPC ............................. H01F 6/06; G01R 33/3815
See application file for complete search history.

(56) References Cited

U.S. PATENT DOCUMENTS

| | | | |
|---|---|---|---|
| 3,818,396 A * | 6/1974 | Raphael | .................... H01F 6/02 335/216 |
| 4,812,797 A | 3/1989 | Jayakumar | |
| 4,974,113 A | 11/1990 | Gabrielse | |
| 6,307,370 B1 | 10/2001 | Schauwecker | |
| 2002/0101240 A1 | 8/2002 | Kasten | |
| 2006/0250204 A1 | 11/2006 | Spreiter | |
| 2007/0024404 A1 | 2/2007 | Westphal | |

FOREIGN PATENT DOCUMENTS

| | | |
|---|---|---|
| DE | 10 2010 042 598 | 4/2012 |
| EP | 0 210 289 | 2/1987 |

\* cited by examiner

*Primary Examiner* — G. M. Hyder
(74) *Attorney, Agent, or Firm* — Paul Vincent

(57) ABSTRACT

A magnet system generates a highly stable magnetic field at a sample location. The magnet system has a magnet cryostat housing a first superconducting magnet coil and a second magnet coil co-axial to the first magnet coil. The second magnet coil is short-circuited in a superconducting persistent mode during operation of the magnet system. An external power supply during operation supplies current to the first magnet coil via a current lead thereby generating a first magnetic field at the sample location that fluctuates according to the current noise of the power supply, wherein the second magnet coil is positioned and dimensioned in a way that it inductively couples to the first magnet coil such that it generates at the sample location a second magnetic field that compensates the fluctuations of the first magnetic field.

18 Claims, 5 Drawing Sheets

MAGNET SYSTEM FOR GENERATION OF A HIGHLY STABLE MAGNETIC FIELD

This application claims Paris convention priority of DE 10 2012 215 507.4 filed Aug. 31, 2012 the entire disclosure of which is hereby incorporated by reference.

BACKGROUND OF THE INVENTION

The invention concerns a magnet system that generates a highly stable magnetic field at a sample location, the magnet system comprising a magnet cryostat housing a first superconducting magnet coil and a second magnet coil co-axially to said first magnet coil which second magnet coil is during operation of the magnet system short-circuited in a superconducting persistent mode.

Such a magnet system in known from U.S. Pat. No. 4,974,113.

The innermost sections of magnet coils producing very high fields may be HTS insert coils that are separately driven by a separate power supply. Outer LTS coils may be operated in a common persistent mode or alternatively also during operation be connected to a power supply which may be the same one. Use of a separate power supply for the HTS insert coils has inter alia the advantage that the operating current of the HTS coils can be different from that of the LTS coils and that the non-persistent HTS current circuit need not be perfectly without any losses since the current is determined by the power supply. However, the power supply introduces noise and instabilities into the system with the consequence that such a system will be unsuitable for magnetic resonance applications which at the sample location need a highly stable, drift-free magnetic field.

From U.S. Pat. No. 4,974,113 a magnet system is known that uses a superconducting main magnet coil and with a superconducting compensation coil in the form of a superconducting closed current path that is inductively coupled to the main magnet coil. External perturbations may cause oscillations of a magnetic field generated by the first coil. These oscillations may be compensated by the compensation coil which can inductively react to changes of the magnetic flux through its cross-section. U.S. Pat. No. 6,307,370 B1 discloses a significantly more complex system, that (as a function of time or frequency, respectively) can also take into account the presence of resistive current circuits (e.g. protection resistors).

NMR magnets for highest magnetic fields as a rule consist of several nested, largely solenoid-shaped superconducting partial coils which are jointly operated in series in persistent current mode.

Presently, pure NMR-suitable magnet coil systems that operate in superconducting persistent current mode are available up to 23.5 Tesla, i.e. 1000 MHz proton frequency. Using presently available LTS materials, the field strength cannot be noticeably increased further since in that case the critical superconductive current will be exceeded in the magnetic field. In order to reach proton frequencies, e.g. around 1200 MHz, in a stable and homogeneous way, in the present situation, the innermost sections of the magnet coil systems must be made from HTS conductors.

However, up to now there are no superconducting joints for HTS conductors, in particular for their connection to LTS conductors like NbTi, which during operation with full design current of a magnet coil with windings inter alia made from these HTS conductors would reliably have sufficiently low ohmic losses in order to enable a highly stable operation in superconducting persistent mode with a sufficiently low field drift that is e.g. necessary for an NMR spectrometer of highest resolution. Moreover, for HTS conductors, the quality of the conductor itself may pose a problem regarding the necessary large conductor lengths with the consequence that also defects within the conductor may prevent persistent operation with sufficient low drift.

Therefore it is the object of the invention to improve a magnet system with a coil having a drifting superconductor or a superconductor with joints that introduce a drift that cannot be compensated by state of the art drift compensation measures, in a way that with such a magnet system a highly stable magnetic field can be generated.

SUMMARY OF THE INVENTION

According to the invention, this object is achieved by providing an external power supply that during operation supplies current to the first magnet coil via a current lead thereby generating a first magnetic field at the sample location that fluctuates according to the current noise of the power supply and by positioning and dimensioning the second magnet coil in a way that it inductively couples to the first magnet coil such that it generates at the sample location a second magnetic field that compensates the fluctuations of the first magnetic field.

The first magnet coil represents the potentially drifting section of the magnet system and, according to the invention, it is driven by a, preferably highly stable (e.g. $10^{-7}$) external power supply. In that way, a drift resulting from the conductor or joint is excluded. However, during operation the current will contain noise within the limit of the power supply specifications. This noise is transferred to the magnetic field of the first magnet coil operated in that way. According to the invention, in addition to the first magnet coil there is provided a superconducting compensation coil (second magnet coil) with a superconducting switch which compensation coil is, during operation, superconductively short-circuited by the switch and which during operation essentially carries no current. The compensation coil is arranged and dimensioned in such a way that the magnetic field fluctuations of the first magnet coil at the sample location are compensated (e.g. inside an NMR measuring volume which is situated in the center of the magnet system). The compensation is effected by inductive coupling of the second magnet coil with the potentially drifting first magnet coil: the short-circuited second superconducting magnet coil which is coupled to the first magnet coil reacts to the magnetic flux changes created by the current fluctuations of the external power supply. According to the invention, suitable positions and dimensions of the second magnet coil are chosen such that the inductive coupling to the first magnet coil generates compensation currents in the second magnet coil which compensate the fluctuations of the first magnetic field over the range of the fluctuations of the power supply. In this way, a highly stable magnetic field is achieved at the sample location (and to a good approximation also within its immediate surrounding), i.e. a magnetic field whose fluctuations are considerably smaller than those of a commercial power supply (preferably several, in particular one to three orders of magnitude smaller). The compensation currents induced in this way in the second magnet coil are smaller by many orders of magnitude than the power supply current. Therefore, the compensation coil essentially still carries no current. The current strength is dependent from the number of layers of the first and second magnet coil and for a single layer compensation coil (second coil) it is in the order of the power supply current noise (e.g. $10^{-7}$ of the power supply current) multiplied by the number of layers of the first magnet coil (e.g. 10-100 layers). The magnetic field generated by the second magnet coil (per unit current) is approximately proportional to the number of layers of the second magnet coil (otherwise, the coils have roughly about the same geometry). For a single layer second magnet coil, the compensation current is therefore about 10 to 100 times the current noise in the first magnet coil.

In order to achieve a compensation of the power supply fluctuations, the second magnet coil has to be suitably positioned and dimensioned. An immediately evident example of an embodiment of the inventive compensation arrangement would be a superconductively short-circuited compensation coil that is wound in a bifilar way with the potentially drifting first magnet coil, which first and second coils have the same field profile and therefore the second magnet coil compensates each fluctuation of the first magnet coil introduced by the non-perfect power supply over the entire volume of space. Presently available standard computer programs make it possible to calculate the induction matrix for the most complex arrangements of coils/sections (with known geometry of the magnet coils) and thereby to calculate the dimensions of the compensation coil, in analogy to the compensation of external field perturbations as e.g. described in U.S. Pat. No. 4,974,113 A.

By using an external power supply for the first magnet coil and by providing a second magnet coil which compensates the magnetic field fluctuations generated by the first magnet coil, it is possible to use for the first magnet coil superconductor material which drifts on its own or which can only be short-circuited by means of drifting joints (e.g. HTS material). In this way, the positive properties of such materials (in particular the current carrying capacity in a magnetic field) can nevertheless be used.

The first and second magnet coils are arranged co-axially to a z-axis. The highly stable magnetic field shall be along z. The sample location describes a (small) measurement volume within the superconducting magnet coils, into which a sample to be measured is introduced (e.g. for an NMR spectroscopy measurement). The magnet system creates a highly stable, homogeneous magnetic field inside this volume. The sample location may e.g. be the geometric center of the magnet system (plus a small area around the geometric center, dependent on the samples to be investigated).

Preferably, the first magnet coil and the second magnet coil are arranged on a common sample holder and the second magnet coil is arranged radially inside the first magnet coil and is axially shorter than the first magnet coil. Therefore the second magnet coil forms the radially innermost layer(s). An arrangement where the second magnet coil is not wound onto the coil former but attached to it from the inside is topologically more difficult but also possible.

In a preferred embodiment, the second magnet coil is wound with an HTS conductor, in particular with an YBCO conductor (coated conductor). This makes it possible to place the second magnet coil into a high magnetic field. Since the second magnet coil need not carry any current to speak of, copper stabilization of the HTS conductor may be reduced or even completely omitted. To a certain extent, this is also true for the steel tape carrying the coated conductor (YBCO), which can also be reduced since lack of current also implies lack of magnetic Lorentz-forces.

In a first advantageous modification of this embodiment, the HTS conductor is in the form of a slotted conductor tape, the slot extending between the two ends of the tape thereby generating a continuous, closed superconducting current path, wherein two parts of the conductor tapes separated by the slot are wound to form the second magnet coil such that a superconducting persistent current follows the windings of both parts in the same sense of rotation. With the exception of both ends of the conductor tape, the slot extends along the entire length of the HTS conductors and the slot is formed in a way such that the conductor tape forms a closed loop enclosing the slot. The parts of the conductor tape can be wound to a double-coil, the slotting dividing the coil into two partial coils. The partial coils are turned and/or shifted with respect to each other so that a current within the closed loop has the same sense of rotation in both partial coils.

In an alternative advantageous embodiment, the second magnet coil is wound with an LTS conductor, in particular a Nb3Sn conductor. Further LTS materials that can be used for the second magnet coil, are e.g. Nb3Ge or Nb3Al. LTS materials can be connected reliably by superconducting joints or switches, respectively. Therefore, the second magnet coil can be short-circuited without problems. Coils from these LTS materials, which e.g. are standard for the innermost coil sections of prior art NMR magnet coils, are usually produced according to the so-called "wind-and-react-method". I.e., a coil made from a pre-conductor is wound onto a bobbin and afterwards heat treated in an annealing furnace for a longer time period, whereupon the superconducting LTS conductor, e.g. Nb3Sn, is finally formed by solid state diffusion. According to this method, it is preferred to fix the layer(s) of the second magnet coil to the bobbin and to wind the layers of the first (HTS) magnet coil on top of this (those).

In a particular embodiment, the first superconducting magnet coil consists of several co-axial first partial coils that are connected in series.

It may be advantageous that the second magnet coil comprises several co-axial second partial coils which are either separately or jointly superconductively short-circuited and which jointly compensate fluctuations of the first magnetic field at the sample location.

The partial coils of a magnet coil may be wound onto separate coil bobbins and may be connected by joints.

In order to reach the highest stable magnetic field strengths, it is particularly preferred to co-axially surround the first and the second magnet coil by a superconductively short-circuited further magnet coil, whereby during operation, the further magnet coil generates a further magnetic field at the sample location, which is preferably larger than the first magnetic field and whereby the presence of the further magnet coil is taken into account for the positioning und dimensioning of the second superconducting magnet coil (induction matrix of the total system). In this constellation, a coil allowing to generate high magnetic fields (e.g. an LTS coil) can be used as a further coil and a coil with high current-carrying capacity in extremely high fields (e.g. an HTS coil) as a first magnet coil. In this way, in spite of the fact that because of the limited current-carrying capacity of LTS conductors in magnetic fields the generation of highest magnetic fields requires additional HTS conductors, it nevertheless is possible to use LTS conductors for the stabilizing second coil even in the range of highest magnetic fields—at least as long as they have not reached their critical field for zero current.

Since the magnet system of the invention makes use of a system of inductively coupled coils (first, second and further coil), the superconductively short-circuited magnet coils (second and further coil) couple to the first magnet coil and to each other and react to fluctuations by compensation currents which create fields at the sample location. Therefore, in order to achieve a highly stable magnetic field at the sample location, the dimensioning and positioning of the second magnet coil hast to take into account all coupling coils such that the joint field contributions of all coils together lead to fluctuation zero. To this end, the induction matrix of the total system has to be taken into account and the field generated by a current change in the second magnet coil at the sample location has to be set to zero. The actual calculation process for such a system may start in first approximation with a single layer compensation coil (second magnet coil) for the first magnet coil since couplings to the surrounding further coils are weaker. This simple starting system may then be modified and optimized.

The further magnet coil may consist of several partial coils (further partial coils) which are jointly superconductively short-circuited.

It is particularly preferred that, during operation, at least the further magnet coil or a partial coil of the further magnet coil carries a superconducting persistent current with a reversed sense of rotation with respect to the current through the first magnet coil, in such a way that the stray field of the magnet system is further reduced compared to the stray field of a magnet system without a reversed further (partial) magnet coil.

The further (partial) coil with reversed current (with respect to the first magnet coil) then acts as an active stray field compensation. "Stray field" means the total field of all magnet coils of the magnet system radially outside the outermost magnet coil (further magnet coil). The design and arrangement of the individual coils are jointly optimized so that in good approximation the total dipole moment is zero or that the field outside a defined area immediately about the cryostat of the magnet system is everywhere smaller than e.g. 5 Gauss ("5-Gauss line"). Since the first magnet coil is driven by the power supply and there are independent short-circuited (second and further magnet coils), in order to avoid excessive inductive transfer of current to a partial coil (and the associated risk of its destruction) as well as in order to avoid a "stray field flash", i.e. a short term generation of a large stray field by inductive current transfer, the safety concept of the total apparatus has to be accordingly adapted for the case of a quench.

Preferably, the second magnet coil or a partial coil of the second magnet coil is wound with a conductor that at the temperatures and magnetic field existing at its operating position, has critical current strengths which are below the persistent current strength of the further magnet coil.

In a particular embodiment of the inventive magnet system, the second magnet coil or a partial coil of the second magnet coil is wound with a conductor that at the temperatures and magnetic field existing at its operating position, has critical current strengths which are below the current strength supplied by the power supply.

Therefore, the second magnet coil carries considerably less current that the other magnet coils generating the main magnetic field (first and further magnet coil).

In a particularly preferred embodiment the second magnet coil carries during operation—apart from the induced compensation current—essentially no current. E.g. for fluctuations in the range of $10^{-7}$ the compensation current is in the order of several mA, for fluctuations in the range of $10^{-6}$ in the order of several 10 mA. As a consequence, the second magnet coil can be designed near its critical field (in zero current). This is no disadvantage. To the contrary: Close to its critical field, the second magnet coil can carry only a very small current with the consequence that each massive perturbation that leads to a considerable current increase (quench of another coil/partial coil or failure of the power supply) will immediately cause a quench which will happen at a still very low current, therefore not destroying the LTS conductor (quench protection). However, such considerations must not stay isolated but have to be integrated into a broader, more general protection concept of the total system that considers all possible and probable emergency cases. For example, the second magnet coil might after a quench "recover" in the decreasing field and could now carry larger currents and afterwards quench again with a large current flowing. For the case of a quench one should therefore provide a protection circuit that relatively fast opens the superconducting switch of the second magnet coil.

In order to save space, a single-layered second magnet coil is particularly preferred.

In particular high field applications will benefit from the magnet system according to the invention. Therefore, a particularly preferred embodiment of the invention uses a magnet system that generates during operation at the sample location a magnetic field larger than 23.5 Tesla, preferably larger than 27 Tesla.

Preferably, the magnet cryostat has a room temperature bore that houses the sample location and that is co-axial to the axis of first and second magnet coil. Thus, the sample may be investigated at room temperature.

Preferably, the first, second and the optionally present further superconducting magnet coil are located inside a helium tank within the magnet cryostat of the magnet system, having during operation a temperature below 4 K.

In a particular improvement of this magnet system, the first and second superconducting magnet coils are in a lower part of the helium tank below a thermal barrier and during operation have a temperature below 4 K and the current lead to the power supply is guided through an upper part of the helium tank above the thermal barrier with a temperature above 4 K. In case a further magnet coil is provided, this, too, is located in the lower part of the same helium tank.

Preferably, the second superconducting magnet coil is designed with respect to its position and dimensions taking into account the presence of all current circuits of the magnet system that during operation are superconductively short-circuited. Therefore, the positioning and dimensioning of the second superconducting magnet coil will depend on the mutual interaction between the individual current loops (i.e. on the size of the mutual inductances).

In order to achieve a particularly accurate compensation, the positioning and dimensioning of the second superconductive magnet coil additionally accounts for the presence of highly conductive structures within the magnet system. "Highly conductive structures" mean all metallic, cold structures, in particular coil bobbins and radiation shields, but also the electric circuits of the protection resistors of coil sections which have a very low ohmic resistance. Induction and eddy currents, respectively, generated in these structures by field fluctuations, can be described by a circuit of coupled inductances (as the case may be also capacitances) and resistances simulated numerically and the temporal course of the magnetic field at the sample location after a characteristic perturbation or the frequency response, respectively, is calculated and optimized. This may be achieved—adapted to the present boundary conditions—by using algorithms as e.g. described in U.S. Pat. No. 6,307,370 B1.

The invention also concerns an NMR spectrometer comprising a magnet system as described above. In order to use the inventive magnet system with an NMR spectrometer, the magnetic field generated by the inventive magnet system has to be sufficiently stable that it can fulfill—if needs be in combination with a per se known NMR lock system and/or with further known measures to compensate drifts—the requirements of high resolution NMR spectroscopy) ($\Delta B/B < 10^{-10}$).

Further advantages of the invention are apparent from the specification and the figures. Moreover, the features mentioned above and further below may be employed each on its own or in any combination. The embodiments as shown and described are not to be understood as a conclusive enumeration but rather have an exemplary character for the presentation of the invention.

The figures show:

BRIEF DESCRIPTION OF THE DRAWING

FIG. 1b the circuit scheme of a magnet coil arrangement according to FIG. 1a;

FIG. 4 a longitudinal section of a magnet system according to the invention with a magnet coil arrangement according to FIG. 1a.

DESCRIPTION OF THE PREFERRED EMBODIMENT

Figure 1A:
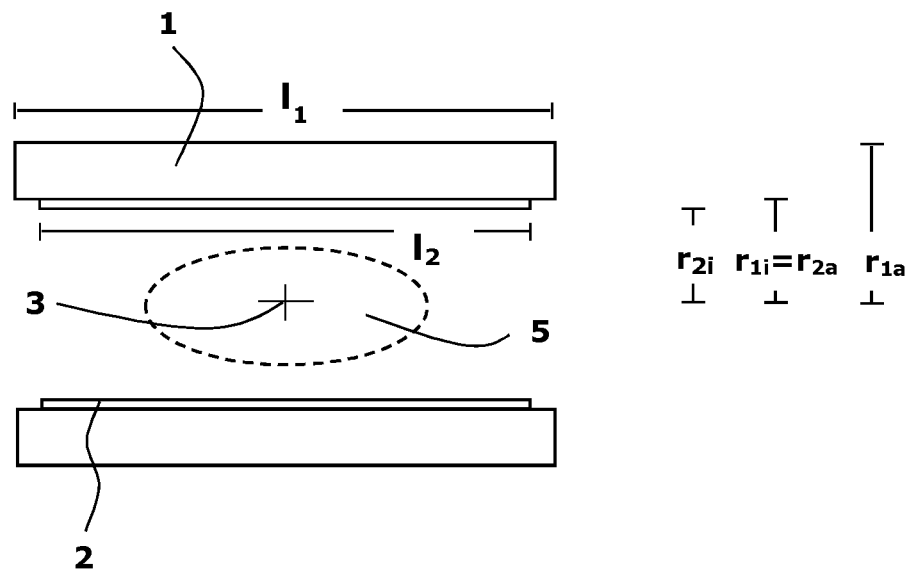
FIG. 1a a longitudinal section of a magnet coil arrangement for a magnet system according to the invention with a first and a second magnet coil.
Figure 1B:
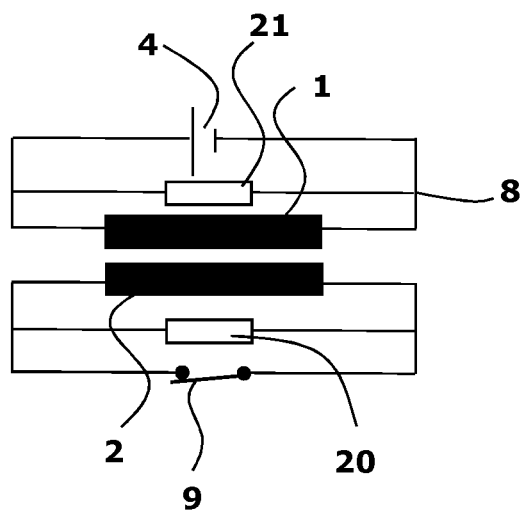

FIG. 1a shows a magnet coil arrangement with a first magnet coil 1 and a second magnet coil 2, which are arranged co-axially about the center 3 of a magnet coil system. The embodiment described below employs an HTS coil as a first magnet coil 1 and an LTS coil as a second magnet coil. The first magnet coil generates the main magnetic field. In order to minimize a drift of the magnetic field generated by the first magnet coil 1, the first magnet coil 1 is operated by an external power supply 4 which is connected to the first magnet coil 1 by a current lead 8 (FIG. 1b). Therefore the stability of the magnetic field generated by the first magnet coil 1 depends on the stability of the power supply 4 ab. During operation, the second magnet coil 2 is short-circuited by a superconducting switch 9 being connected to the LTS conductor of the second magnet coil 2, in the per se known manner. The magnetic field fluctuations of the first magnet coil 1 induce in the second magnet coil compensation currents, which are very small. Since superconducting switch 9, too, need not carry any significant currents, the LTS conductor of the second magnet coil 2 may be short-circuited at a location which experiences a magnetic field strength where the superconducting switch 9 is (just) operating reliably, i.e., if necessary, closer to the second magnet coil 2 than would be the case for conventional current carrying switches. The first magnet coil 1 does not need any superconducting switch, since during operation it is supplied with current by the highly stable power supply 4. Resistances 20, 21 in FIG. 1b symbolize and represent optional more complex arrangements of protection resistors or diodes for the protection of the individual magnet coils 1, 2 or their sections, respectively, as well as for protection of the superconducting switch 9.

In the embodiment shown in FIG. 1a the first magnet coil 1 is designed as a thick solenoid. In this embodiment, the field noise of the first magnet coil 1 is compensated in its center 3 and to a good approximation also inside a surrounding measuring volume 5 that can house a sample (sample location) by the second magnet coil 2. The first magnet coil 1 is wound onto the second magnet coil 2, such that the inner radius $r_{1i}$ of the first magnet coil 1 corresponds to the outer radius $r_{2a}$ of the second magnet coil 2. In the present embodiment, the second magnet coil 2 is a shorter, single-layered superconductively short-circuited solenoid coil. For the design of the second magnet coil 2, certain parameters (here: shape, number of layers, material, outer radius $r_{2a}$ of the second magnet coil 2) can be predetermined and fixed. By adapting the parameters that are not rigidly predetermined (here: length $l_2$ of the second magnet coil 2) the second magnet coil 2 may be designed such that within the measuring volume 5 it compensates magnetic field fluctuations occurring inside the magnet coil 1 because of current fluctuations of the power supply 4.

In the present case, a single-layered solenoid coil was chosen as the second magnet coil 2. By means of a computer program, the length 12 of the second magnet coil 2 was calculated, which is necessary for compensation of the magnetic field fluctuations. The present embodiment employs a magnet coil 1 which is a solenoid with length $l_1=40$ cm, inner radius $r_{1i}=51$ mm, outer radius $r_{1a}=83$ mm, consisting of 40 layers of an HTS tape conductor (4 mm×0.8 mm), with a field amplitude of 119.1 G/A and a self-inductance of 520.2 mH. The magnetic field fluctuations in the first magnet coil 1 can be compensated by a second magnet coil 2 having the following properties: length $l_2=37.8$ cm, inner radius $r_{2i}=50$ mm, outer radius $r_{2a}=51$ mm, 1 layer LTS-wire (2 mm×1 mm), field lift 6.07 G/A, self-inductance: 0.852 mH. The mutual inductance with the first magnet coil 1 is 16.706 mH. This arrangement completely compensates the field fluctuations of the first magnet coil 1. However, in case additional metallic components are present with R/L time constants (e.g. coil bobbins), there are resulting frequency dependencies of the shielding effect. As an example, for the above arrangement we assume a coil support with about 50 cm length and a thickness of 3 mm. The coil support may be considered as a single-layer solenoid with one winding. The field amplitude is in the order of tens of milliGauss/A, the self-inductance in the range of some nanoHenry, the resistance is some µOhm, the mutual inductance with the first magnet coil 1 is in the range of some ten µH, the mutual inductance with the second magnet coil 2 is in the range of some µH. At a frequency of 100 Hz, such a coil support reduces the shielding from the ideal value 0 to about 5/10000. This value is certainly negligible. However, the inventive magnet system may also comprise other components as for example the protection circuit of magnet coils 1, 2 (protection resistors 20, 21), with time constants leading to larger contributions. These (frequency dependent) contributions of resistive components (coil supports, protection resistor circuitry and the like) can be taken into account for the design of second magnet coil 2 in order to optimize the compensation effect of the second magnet coil 2.

Figure 2:
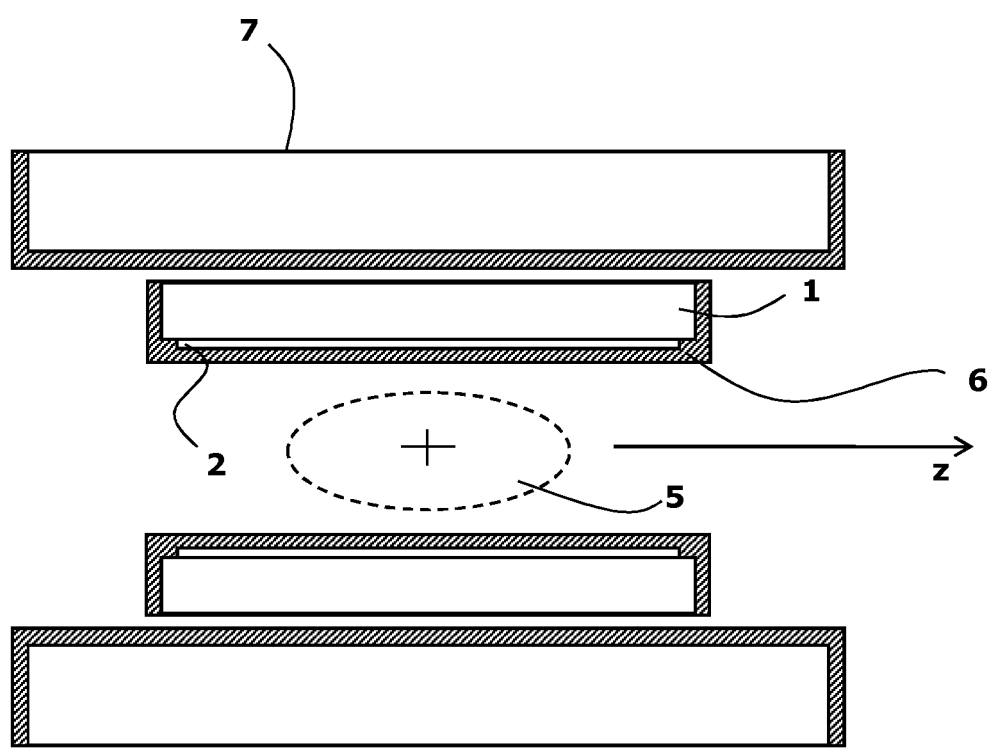
FIG. 2 a longitudinal section of a magnet coil arrangement for a magnet system according to the invention with a further magnet coil.

FIG. 2 shows a magnet coil arrangement, where the first magnet coil 1 and the second magnet coil 2 that is short-circuited during operation are located on a common coil support 6. Apart from the first magnet coil 1 and the second magnet coil 2, a further magnet coil 7 of LTS material is provided, that is arranged radially outside both other magnet coils 1, 2 and co-axial to these (with respect to a z-axis). The further magnet coil 7 may comprise several partial coils which during operation are jointly superconductively short-circuited.

By providing the further LTS magnet coil 7 particularly high magnetic fields can be realized. However, since the further magnet coil 7 couples to the other magnet coils 1,2, this coupling has to be taken into account for the design of the second magnet coil 2.

Figure 2B:
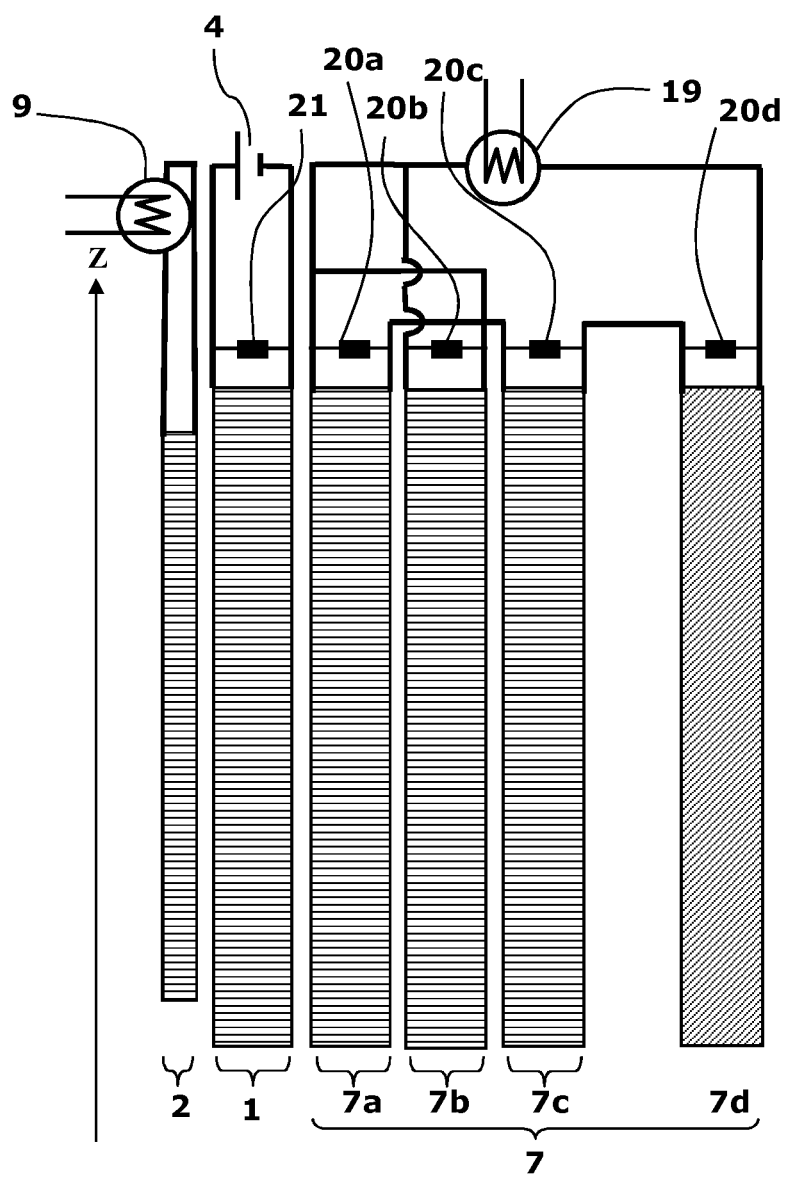
FIG. 2b a circuit scheme example for the magnet coil arrangement of FIG. 2.

FIG. 2b shows the circuitry of a magnet coil system according to the invention. The further magnet coil 7 surrounds the first magnet coil 1 radially and in the shown embodiment comprises four partial coils 7a, 7b, 7c, 7d, which may be made from different materials. Please note that for simplicity in the sectional representation only the right half of the magnet coil arrangement is shown. The partial coils 7a, 7b, 7c, 7d are in series and jointly short-circuited via a superconducting switch 19, that is arranged with an axial distance from the further magnet coil. The outermost partial coil 7d carries a persistent superconducting current with reversed sense of rotation compared to the current through the first magnet coil 1 and the inner partial coils 7a, 7b, 7c of the further magnet coil 7 and therefore acts as a shielding coil. Partial coil 7d is dimensioned such that the stray field of the magnet system 10 is reduced or to a large extent compensated compared to the stray field of the magnet system without the partial coil 7d with reversed current.

First magnet coil 1 is protected by a protection resistor 1. Partial coils 7a, 7b, 7c, 7d are jointly protected by protection resistance network 20a, 20b, 20c, 20d. The presence of protection resistors 20a, 20b, 20c, 20d, 21 and the linking current paths are preferably taken into account for the design of the second magnet coil 2.

Figure 3:
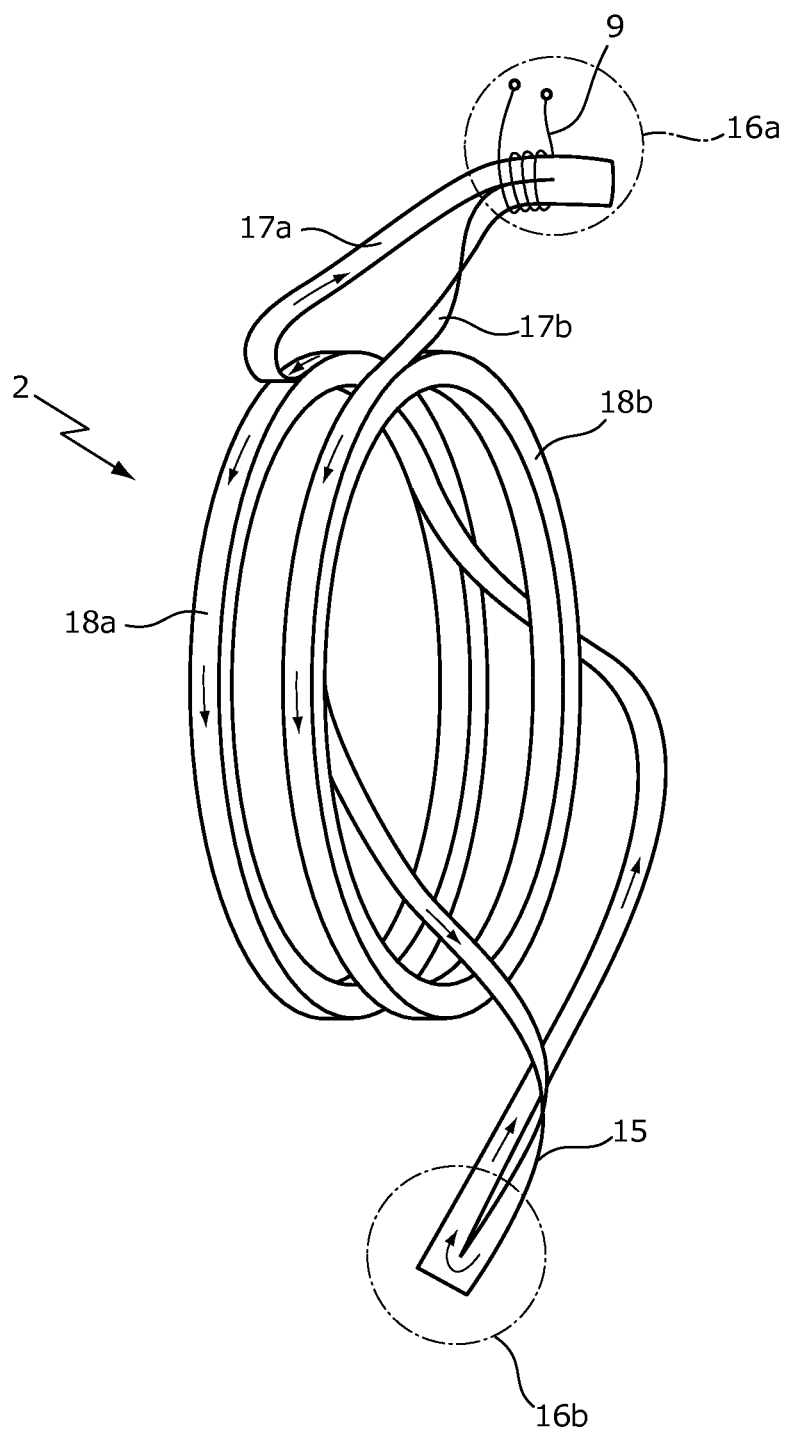
FIG. 3 an embodiment of the winding technique of a second magnet coil in the form of a slotted tape conductors.

Second magnet coil 2 may be made from a slotted superconductor tape 15, as shown in FIG. 3. The slot extends along the longitudinal axis between both ends 16a, 16b of the superconductor tape 15 and divides the superconductor tape 15 into two partial tapes 17a, 17b. The ends 16a, 16b of the superconductor tape 15 each comprise a range that is not slotted and that functions as a connection between both partial tapes 7a, 17b, such that the slotted superconductor tape 15 forms a closed loop. The partial tapes 17a, 17b each are wound to form a partial coil 18a, 18b, e.g. to pancake (as shown) coils or preferably to solenoid coils. The partial coils 18a, 18b are tilted with respect to each other, such that both partial coils 18a, 18b carry a current with the same sense of rotation. End 16a of the superconductor tape 15 can be transferred to the normalconducting state e.g. by means of a heater winding and act as a superconducting switch 9.

Figure 4:
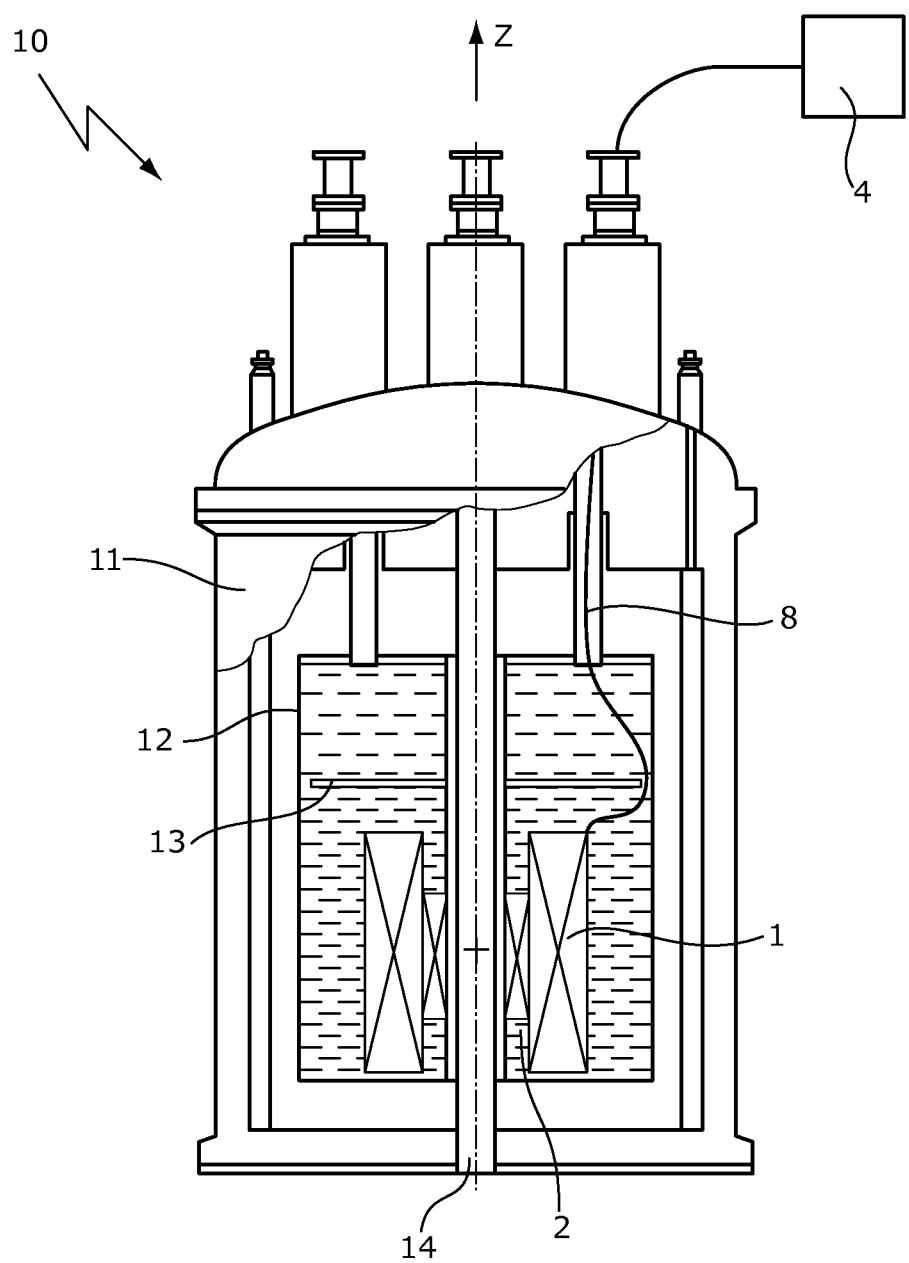

FIG. 4 shows a magnet system 10 according to the invention with a helium tank 12 inside a cryostat 11. The magnet coils (here: first and second magnet coil 1, 2) are located in a lower part of helium tank 12 with a temperature<4K and which lower part is separated from an upper part of the helium tank 12 by a thermal barrier 13. A current lead 8 leads via the upper part to power supply 4. The magnet system 10 comprises a room temperature bore 14 inside which a sample may be positioned to be measured.

The above-described separation into LTS and HTS parts is not mandatory. The invention may successfully be applied in any situation where the first magnet coil uses (must use) a conductor that can carry the coil current but that, in a superconductive persistent mode, is not drift-free—and be it only because no respective further conductor is available that can be used in superconducting persistent mode with sufficiently low drift and that (for zero current) stays (just) superconducting in a high magnetic field. It could even be the same HTS conductor, e.g. in case a good joint does not work up to full current. The invention may advantageously be combined with per se known measures for drift and perturbation compensation as well as for the protection of the magnet coil arrangement and of the surroundings in case of a quench.

REFERENCE NUMERALS

1 first magnet coil
2 second magnet coil
3 center of the magnet coil arrangement
4 power supply
5 measuring volume
6 coil support
7 further magnet coil
7a, b, c, d partial coils of further magnet coil
8 current lead
9 superconducting switch of second magnet coil
10 magnet system
11 cryostat
12 helium tank
13 thermal barrier
14 room temperature bore
15 superconductor tape
16a, b ends of superconductor tape
17a, b partial tapes
18a, b partial coils
19 superconducting switch of further magnet coil
20a, b, c, d protection resistors of further magnet coil
21 protection resistor of first magnet coil
$r_{1a}$ outer radius of first magnet coil
$r_{1i}$ inner radius of first magnet coil
$r_{2a}$ outer radius of second magnet coil
$r_{2i}$ inner radius of second magnet coil
$l_1$ length of the first magnet coil
$l_2$ length of the second magnet coil

I claim:

1. A magnet system that generates a highly stable magnetic field at a sample location, the magnet system comprising:
    a magnet cryostat housing a first superconducting magnet coil and a second magnet coil co-axial to said first magnet coil which second magnet coil is during operation of the magnet system short-circuited in a superconducting persistent mode; and
    an external power supply that during operation supplies current to the first magnet coil via a current lead thereby generating a first magnetic field at the sample location that fluctuates according to a current noise of the power supply, wherein the second magnet coil is positioned and dimensioned in a way that it inductively couples to the first magnet coil such that it generates at the sample location a second magnetic field that compensates the fluctuations of the first magnetic field caused by the current noise of the power supply, wherein the first magnet coil and the second magnet coil are arranged on a common sample holder and the second magnet coil is arranged radially inside the first magnet coil and is axially shorter than the first magnet coil, the second magnet coil thereby having an inner radius which is smaller than an inner radius of the first magnet coil.

2. Magnet system according to claim 1, wherein the second magnet coil is wound with an HTS conductor.

3. Magnet system according to claim 2, wherein the HTS conductor is in the form of a slotted conductor tape, the slot extending between two ends of the tape thereby generating a continuous, closed superconducting current path, wherein two parts of the conductor tapes separated by the slot are wound to form the second magnet coil such that a superconducting persistent current follows the windings of both parts in the same sense of rotation.

4. Magnet system according to claim 1, wherein the second magnet coil is wound with an LTS conductor.

5. Magnet system according to claim 1, wherein the second magnet coil comprises several co-axial second partial coils which are separately or jointly superconductively short-circuited and which jointly compensate fluctuations of the first magnetic field at the sample location.

6. Magnet system according to claim 1, wherein the first and the second magnet coil are co-axially surrounded by a superconductively short-circuited further magnet coil, wherein during operation, the further magnet coil generates a further magnetic field at the sample location, which is larger than the first magnetic field and wherein a presence of the further magnet coil is taken into account for positioning und dimensioning of the second superconducting magnet coil.

7. Magnet system according to claim 6, wherein during operation, at least the further magnet coil or a partial coil of the further magnet coil carries a superconducting persistent current with a reversed sense of rotation with respect to the current through the first magnet coil, in such a way that a stray field of the magnet system is further reduced compared to a stray field of a magnet system without a reversed further magnet coil or further partial magnet coil.

8. Magnet system according to claim 6, wherein the second magnet coil or a partial coil of the second magnet coil is wound with a conductor that at temperatures and magnetic field existing at its operating position, has critical current strengths which are below a persistent current strength of the further magnet coil.

9. Magnet system according to claim 6, wherein the second magnet coil or a partial coil of the second magnet coil is wound with a conductor that at temperatures and magnetic field existing at its operating position, has critical current strengths which are below a persistent current strength of the further magnet coil and wherein the second magnet coil or a partial coil of the second magnet coil is wound with a conductor that at temperatures and magnetic field existing at its operating position, has critical current strengths which are below a current strength supplied by the power supply, and wherein, apart from an induced compensation current, the second magnet coil carries essentially no current during operation.

10. Nuclear magnetic resonance spectrometer with the magnet system according to claim 9.

11. Magnet system according to claim 1, wherein the second magnet coil or a partial coil of the second magnet coil is wound with a conductor that at temperatures and magnetic field existing at its operating position, has critical current strengths which are below the current strength supplied by the power supply.

12. Magnet system according to claim 1, wherein, apart from an induced compensation current, the second magnet coil carries essentially no current during operation.

13. Magnet system according to claim 1, wherein the second magnet coil is single-layered.

14. Magnet system according to claim 1, wherein, during operation and at the sample location, the magnet system generates a magnetic field larger than 23.5 Tesla.

15. Magnet system according to claim 1, wherein the first and second superconducting magnet coils are in a lower part of a helium tank of the magnet cryostat below a thermal barrier and, during operation, have a temperature below 4 K and the current lead to the power supply is guided through an upper part of the helium tank above the thermal barrier with a temperature above 4 K.

16. Magnet system according to claim 1, wherein for the positioning and dimensioning of the second superconducting magnet coil the presence of all during operation superconductively short-circuited current loops of the magnet system are taken into account.

17. Magnet system according to claim 16, wherein for the positioning and dimensioning of the second superconducting magnet coil the presence of highly conductive structures within the magnet system is also taken into account.

18. Nuclear magnetic resonance spectrometer with the magnet system according to claim 1.

* * * * *